(12) United States Patent
Cheng et al.

(10) Patent No.: US 9,318,574 B2
(45) Date of Patent: Apr. 19, 2016

(54) METHOD AND STRUCTURE FOR ENABLING HIGH ASPECT RATIO SACRIFICIAL GATES

(71) Applicant: International Business Machines Corporation, Armonk, NY (US)

(72) Inventors: Kangguo Cheng, Schenectady, NY (US); Ryan O. Jung, Rensselaer, NY (US); Fee Li Lie, Albany, NY (US); Jeffrey C. Shearer, Albany, NY (US); John R. Sporre, Albany, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/307,986

(22) Filed: Jun. 18, 2014

(65) Prior Publication Data

US 2015/0372113 A1 Dec. 24, 2015

(51) Int. Cl.
*H01L 21/336* (2006.01)
*H01L 29/66* (2006.01)
*H01L 27/088* (2006.01)
*H01L 29/04* (2006.01)
*H01L 29/16* (2006.01)
*H01L 29/423* (2006.01)
*H01L 29/78* (2006.01)

(52) U.S. Cl.
CPC ...... *H01L 29/66545* (2013.01); *H01L 27/0886* (2013.01); *H01L 29/04* (2013.01); *H01L 29/16* (2013.01); *H01L 29/42356* (2013.01); *H01L 29/66553* (2013.01); *H01L 29/66795* (2013.01); *H01L 29/785* (2013.01)

(58) Field of Classification Search
CPC ............... H01L 21/823431; H01L 21/823437; H01L 21/823468; H01L 29/66545; H01L 27/0886; H01L 29/04; H01L 29/16; H01L 29/42356; H01L 29/66553; H01L 29/66795; H01L 29/785
See application file for complete search history.

(56) References Cited

U.S. PATENT DOCUMENTS

| | | | | |
|---|---|---|---|---|
| 6,479,864 B1 * | 11/2002 | Ko | ..... | H01L 21/31116 257/347 |
| 8,110,466 B2 * | 2/2012 | Shieh | ..... | H01L 21/845 257/288 |
| 8,426,923 B2 * | 4/2013 | Lee | ..... | H01L 21/823431 257/365 |
| 8,492,228 B1 * | 7/2013 | Leobandung | ... | H01L 21/823443 257/308 |
| 8,568,604 B2 | 10/2013 | Doris et al. | | |

(Continued)

FOREIGN PATENT DOCUMENTS

| | | |
|---|---|---|
| WO | WO2013155325 | 10/2013 |
| WO | WO2013155329 | 10/2013 |
| WO | WO2013155332 | 10/2013 |

*Primary Examiner* — Brett Feeney
*Assistant Examiner* — Sophia Nguyen
(74) *Attorney, Agent, or Firm* — Scully, Scott, Murphy & Presser, P.C.; Steven J. Meyers

(57) ABSTRACT

Sacrificial gate structures having an aspect ratio of greater than 5:1 are formed on a substrate. In some embodiments, each sacrificial gate structure straddles a portion of a semiconductor fin that is present on the substrate. An anchoring element is formed orthogonal to each sacrificial gate structure rendering the sacrificial gate structures mechanically stable. After formation of a planarization dielectric layer, each anchoring element can be removed and thereafter each sacrificial gate structure can be replaced with a functional gate structure.

15 Claims, 10 Drawing Sheets

(56) References Cited

U.S. PATENT DOCUMENTS

| | | | | |
|---|---|---|---|---|
| 8,703,556 B2* | 4/2014 | Kelly | H01L 29/66795 | 257/296 |
| 8,722,498 B2* | 5/2014 | Scheiper | H01L 21/823412 | 257/368 |
| 8,846,490 B1* | 9/2014 | Shieh | H01L 29/06 | 257/499 |
| 8,932,957 B2* | 1/2015 | Shieh | H01L 29/66795 | 438/700 |
| 9,059,043 B1* | 6/2015 | Leobandung | H01L 29/785 | |
| 2004/0075121 A1* | 4/2004 | Yu | H01L 29/41733 | 257/288 |
| 2005/0019993 A1* | 1/2005 | Lee | H01L 21/84 | 438/157 |
| 2007/0029624 A1* | 2/2007 | Nowak | H01L 29/785 | 257/401 |
| 2007/0072437 A1* | 3/2007 | Brennan | H01L 21/0338 | 438/761 |
| 2007/0228372 A1* | 10/2007 | Yang | H01L 29/66795 | 257/48 |
| 2007/0241414 A1* | 10/2007 | Narihiro | H01L 27/1203 | 257/401 |
| 2008/0237743 A1* | 10/2008 | Ramin | H01L 21/28097 | 257/407 |
| 2008/0286698 A1* | 11/2008 | Zhuang | H01L 21/0337 | 430/323 |
| 2009/0309167 A1* | 12/2009 | Russ | H01L 21/8249 | 257/370 |
| 2009/0321836 A1* | 12/2009 | Wei | H01L 29/66628 | 257/365 |
| 2010/0081239 A1* | 4/2010 | Min | H01L 21/26586 | 438/151 |
| 2010/0109086 A1* | 5/2010 | Song | H01L 29/785 | 257/365 |
| 2010/0203734 A1* | 8/2010 | Shieh | H01L 21/3086 | 438/706 |
| 2010/0207176 A1* | 8/2010 | Hargrove | H01L 21/28079 | 257/288 |
| 2010/0213553 A1* | 8/2010 | Hargrove | H01L 21/28167 | 257/410 |
| 2010/0213555 A1* | 8/2010 | Hargrove | H01L 21/823842 | 257/411 |
| 2011/0053361 A1* | 3/2011 | Muralidhar | H01L 21/3086 | 438/585 |
| 2011/0084336 A1* | 4/2011 | Luning | H01L 29/66795 | 257/347 |
| 2011/0237046 A1* | 9/2011 | Maszara | H01L 29/66795 | 438/424 |
| 2012/0049286 A1* | 3/2012 | Beyer | H01L 21/0337 | 257/368 |
| 2013/0062708 A1* | 3/2013 | Zhong | H01L 29/66795 | 257/401 |
| 2013/0065371 A1* | 3/2013 | Wei | H01L 21/76224 | 438/294 |
| 2013/0134506 A1* | 5/2013 | Yagishita | H01L 29/66545 | 257/330 |
| 2013/0164924 A1* | 6/2013 | Shieh | H01L 29/7855 | 438/586 |
| 2013/0174103 A1* | 7/2013 | Shieh | H01L 21/823431 | 716/54 |
| 2013/0196488 A1* | 8/2013 | Hekmatshoartabari | H01L 29/66795 | 438/481 |
| 2013/0270568 A1 | 10/2013 | Rabkin et al. | | |
| 2013/0272069 A1 | 10/2013 | Rabkin et al. | | |
| 2013/0273700 A1 | 10/2013 | Rabkin et al. | | |
| 2013/0328124 A1* | 12/2013 | Chou | H01L 29/42364 | 257/351 |
| 2014/0084383 A1* | 3/2014 | Cai | H01L 29/66545 | 257/401 |
| 2014/0252413 A1* | 9/2014 | Utomo | H01L 29/785 | 257/192 |
| 2014/0264600 A1* | 9/2014 | Adam | H01L 29/785 | 257/347 |
| 2015/0054078 A1* | 2/2015 | Xie | H01L 29/785 | 257/347 |
| 2015/0091068 A1* | 4/2015 | Hasche | H01L 21/28123 | 257/288 |
| 2015/0129962 A1* | 5/2015 | Xie | H01L 27/1211 | 257/347 |
| 2015/0255457 A1* | 9/2015 | Loubet | H01L 27/0886 | 257/77 |
| 2015/0255605 A1* | 9/2015 | Loubet | H01L 29/7848 | 257/192 |
| 2015/0325692 A1* | 11/2015 | Zang | H01L 29/785 | 257/365 |
| 2015/0372127 A1* | 12/2015 | Cheng | H01L 29/785 | 257/401 |

* cited by examiner

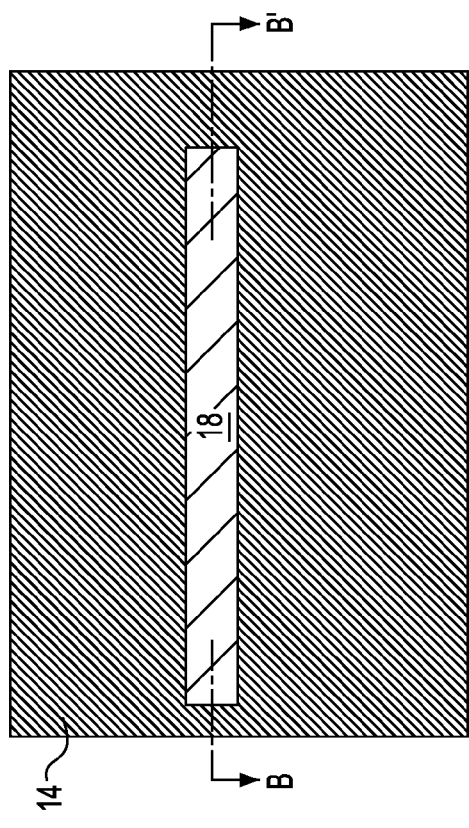
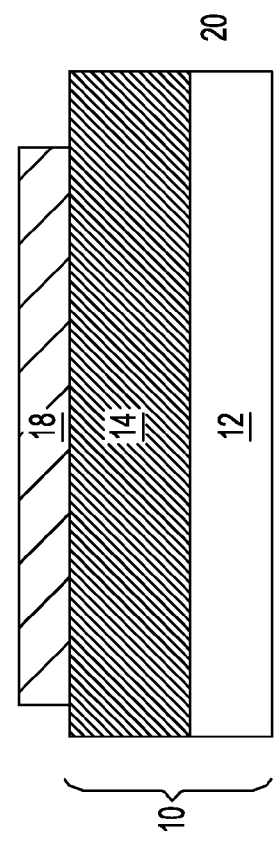
FIG. 1A
FIG. 1B

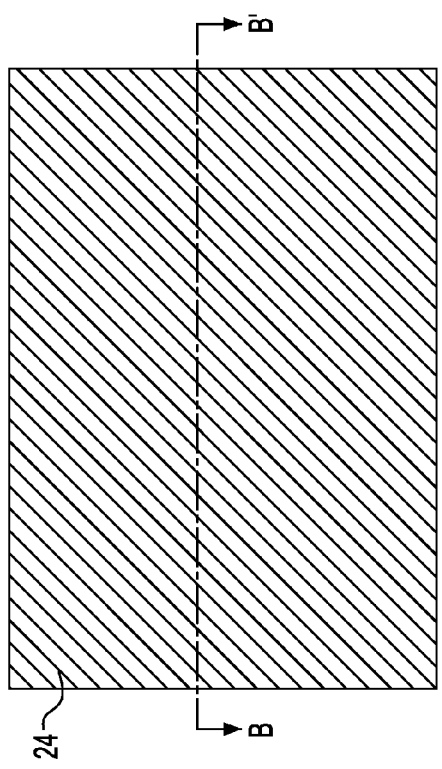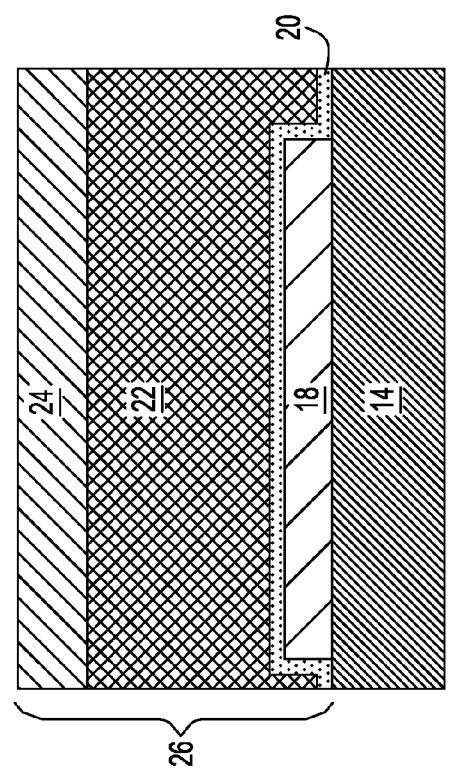

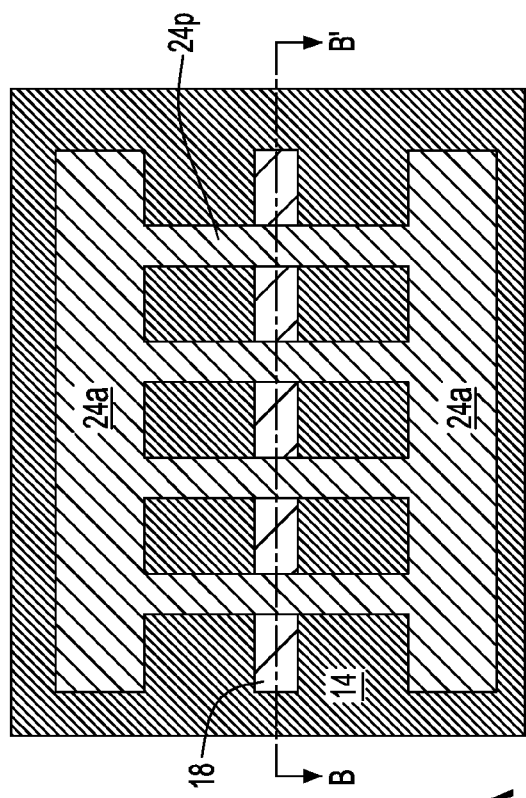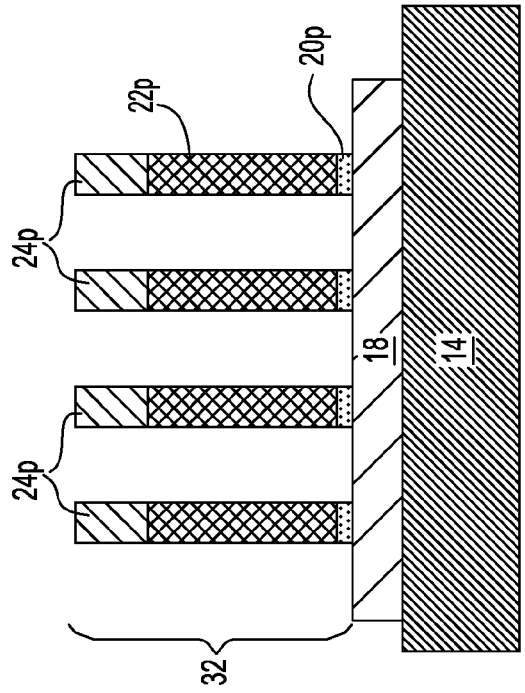
FIG. 5A
FIG. 5B

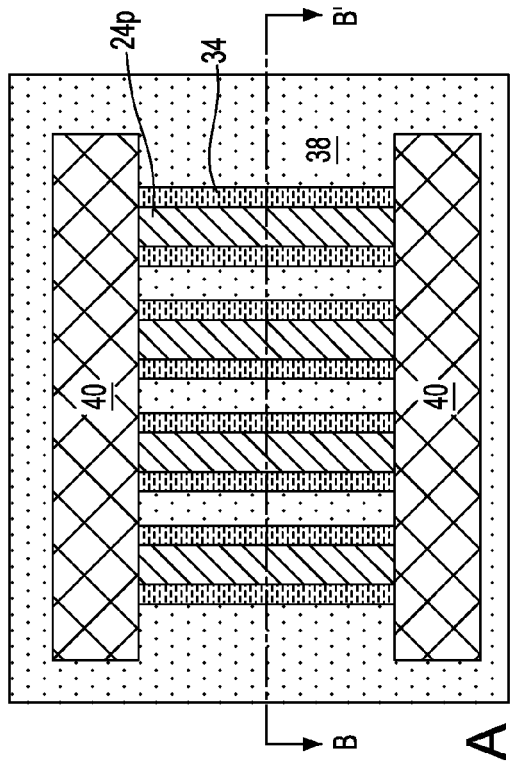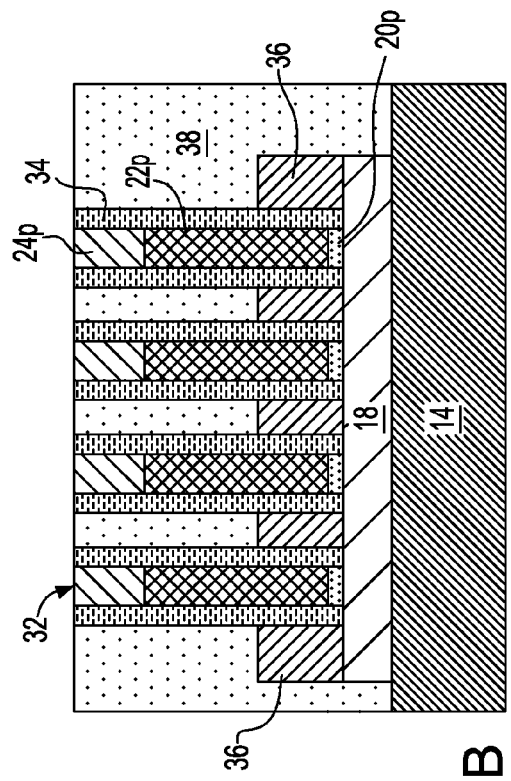
FIG. 7A
FIG. 7B

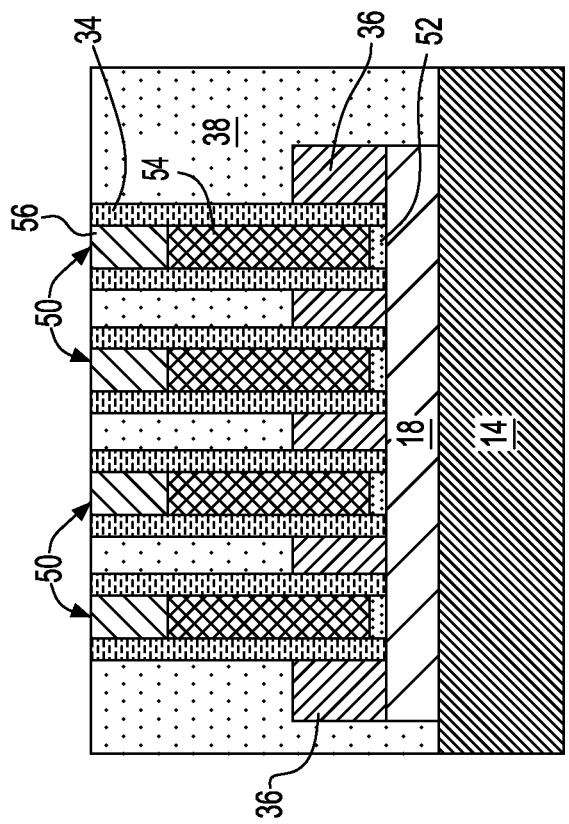
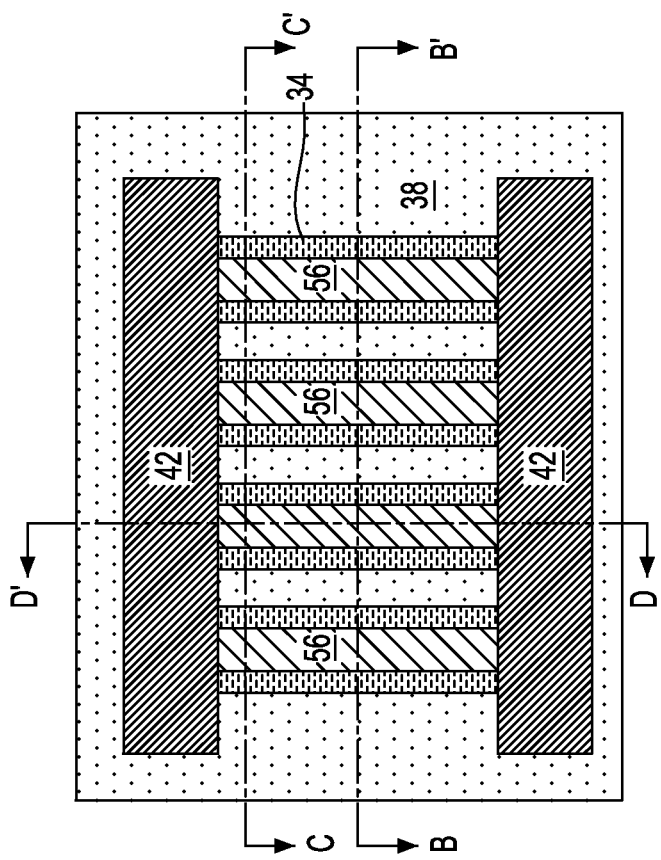
FIG. 9B
FIG. 9A

METHOD AND STRUCTURE FOR ENABLING HIGH ASPECT RATIO SACRIFICIAL GATES

BACKGROUND

The present application relates to a semiconductor structure and a method of forming the same. More particularly, the present application relates to a method for forming a semiconductor structure including a high aspect ratio sacrificial gate structure that is mechanically stable and a semiconductor structure that is formed using the high aspect ratio sacrificial gate structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of CMOS devices. FinFETs are non-planar semiconductor devices which include at least one semiconductor fin protruding from a surface of a substrate. FinFETs can increase the on-current per unit area relative to planar field effect transistors.

In some prior art processes, a functional gate structure including a gate dielectric and a gate conductor can be formed straddling the semiconductor fin prior to formation of a source region and a drain region. By "functional gate structure" it is meant, a structure used to control output current (i.e., flow of carriers in a channel) of a semiconductor device through an electrical field or, in some instances, a magnetic field.

In other prior art processes, a replacement gate process can be used in which a sacrificial gate structure is first provided straddling each semiconductor fin, and then in a later processing step (i.e., after the source region and the drain region have been formed), the sacrificial gate structure is replaced by a functional gate structure. In typical replacement gate processes, a high aspect ratio becomes essential for gate length scaling to accommodate, for example, sacrificial gate open chemical mechanical polishing and self-aligned contacts. The term "high aspect ratio" as used throughout the present application denotes a ratio between gate height and gate width that is about 5:1 or greater. Increasing semiconductor fin height, which is needed for improving device performance, results in a further increase in the aspect ratio. Thus, there is needed a method to robustly form a semiconductor structure which includes high aspect ratio functional gate structures.

SUMMARY

Sacrificial gate structures having an aspect ratio of greater than 5:1 are formed on a substrate. In some embodiments, the sacrificial gate structures can straddle at least one semiconductor fin that is located on the substrate. An anchoring element is formed orthogonal to each sacrificial gate structure rendering the sacrificial gate structures mechanically stable. After formation of a planarization dielectric layer, each anchoring element can be removed and thereafter each sacrificial gate structure can be replaced with a functional gate structure.

In one aspect of the present application, a method of forming a semiconductor structure is provided. The method of the present application includes forming a sacrificial gate stack over a surface of a substrate. Next, a plurality of hard mask structures is provided on a topmost surface of the sacrificial gate stack, wherein an anchoring element is disposed over segments of each hard mask structure. In some embodiments of the present invention, the anchoring element is disposed over end segments of each hard mask structure. The sacrificial gate stack is patterned into a plurality of sacrificial gate structures utilizing the plurality of hard mask structures and the anchoring element as an etch mask.

In another aspect of the present application, a semiconductor structure is provided. The semiconductor structure includes a plurality of functional gate structures located on a surface of a substrate. A dielectric spacer comprising a first dielectric material is located on sidewalls of each functional gate structure of the plurality of functional gate structures. A second dielectric material is located on end portions of each functional gate structure. In accordance with the present application, the second dielectric material that is located on the end portions of each functional gate structure comprises a different dielectric material than said first dielectric material of the dielectric spacer and the second dielectric material is located orthogonal to the dielectric spacer and each functional gate structure.

BRIEF DESCRIPTION OF SEVERAL VIEWS OF THE DRAWINGS

FIG. 1A is a top-down view of an exemplary semiconductor structure after formation of a semiconductor fin on a substrate according to an embodiment of the present disclosure.

FIG. 1B is a vertical cross-sectional view of the exemplary semiconductor structure along the vertical plane B-B' of FIG. 1A.

FIG. 2A is a top-down view of the exemplary semiconductor structure of FIG. 1A after forming a sacrificial gate stack straddling the semiconductor fin.

FIG. 2B is a vertical cross-sectional view of the exemplary semiconductor structure along the vertical plane B-B' of FIG. 2A.

FIG. 5A is a top-down view of the exemplary semiconductor structure of FIG. 4A after patterning the sacrificial gate stack into a plurality of sacrificial gate structures.

FIG. 5B is a vertical cross-sectional view of the exemplary semiconductor structure along the vertical plane B-B' of FIG. 5A.

FIG. 7A is a top-down view of the exemplary semiconductor structure of FIG. 6A after removing each sacrificial gate cap anchoring portion and underlying sacrificial gate material portions and sacrificial gate dielectric portions to form a spacer cavity at end segments of each sacrificial gate structure.

FIG. 7B is a vertical cross-sectional view of the exemplary semiconductor structure along the vertical plane B-B' of FIG. 7A.

FIG. 9A is a top-down view of the exemplary semiconductor structure of FIG. 8A after removing each sacrificial gate structure and forming a functional gate structure into a gate cavity previously occupied by each sacrificial gate structure.

FIG. 9B is a vertical cross-sectional view of the exemplary semiconductor structure along the vertical plane B-B' of FIG. 9A.

DETAILED DESCRIPTION

Figure 3A:
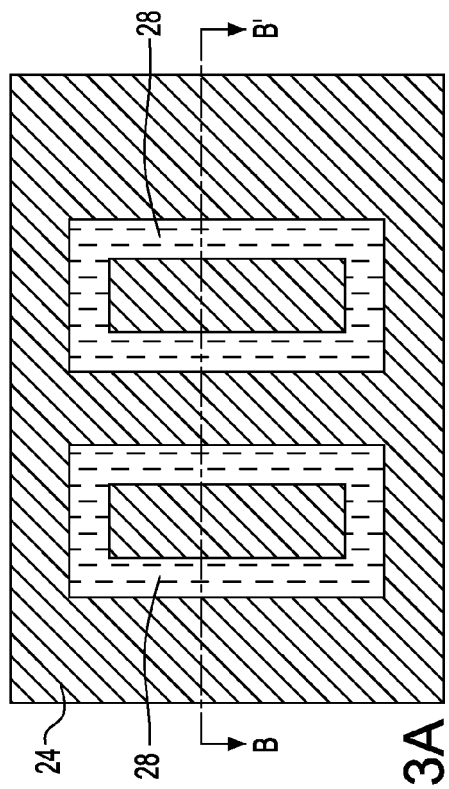
FIG. 3A is a top-down view of the exemplary semiconductor structure of FIG. 2A after forming a plurality of hard mask structures on a topmost surface of the sacrificial gate stack.

The present application will now be described in greater detail by referring to the following discussion and drawings that accompany the present disclosure. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Although the following description and drawings of the present application disclose FinFETs, the present invention is not limited to only FinFET structures. Instead, the present application works for any device including, for example, planar devices, nanowire containing devices and nanotube containing devices that requires tall sacrificial gates.

Referring to FIGS. 1A-1B, an exemplary semiconductor structure according to an embodiment of the present application includes a semiconductor fin 18 that is located on substrate 10. Although a single semiconductor fin 18 is shown, a plurality of such semiconductor fins can be located on different surface portions of the substrate. The semiconductor fins lie parallel to each other. In one embodiment and as shown, the substrate 10 includes a handle substrate 12 and an insulator layer 14. The handle substrate 12 is optional and can be omitted in some instances. In some embodiments, each semiconductor fin 18 that is provided on the insulator layer 14 comprises a remaining portion of a topmost semiconductor layer of a semiconductor-on-insulator (SOI) substrate. In the illustrated embodiment, a material interface exists between the bottommost surface of each semiconductor fin 18 and a topmost surface of insulator layer 14.

In other embodiments (not shown), substrate 10 comprises a remaining portion of a bulk semiconductor substrate that has been processed to include at least one semiconductor fin 18 on a remaining portion of the bulk semiconductor substrate. In such an embodiment, no material interface exists between each semiconductor fin 18 and the remaining portion of the bulk semiconductor substrate.

When present, the handle substrate 12 can include a semiconductor material, a conductive material, and/or a dielectric material. The handle substrate 12 can provide mechanical support to the insulator layer 14, the top semiconductor layer of an SOI substrate, and thus each semiconductor fin 18. The thickness of the handle substrate 12 can be from 30 microns to 2 mm, although lesser and greater thicknesses can also be employed.

When present, the insulator layer 14 may be a crystalline, or non-crystalline, oxide or nitride. In one embodiment, the insulator layer 14 is an oxide such as, for example, silicon oxide. The insulator layer 14 may be a single continuous layer that spans the entirety of the handle substrate 12 or it may be discontinuous. When a discontinuous insulator region is present, the insulator region exists as an isolated island that is surrounded by semiconductor material. The thickness of the insulator layer 14 can be from 50 nm to 5 microns, although lesser and greater thicknesses can also be employed.

The top semiconductor layer, and consequently, each semiconductor fin 18 can include a single crystalline semiconductor material or a polycrystalline material. In one embodiment, each semiconductor fin 18 can include an elemental semiconductor material such as Si or Ge, a semiconductor material primarily composed of Group IV elements such as a silicon-germanium alloy or a silicon-carbon alloy, a III-V compound semiconductor material, II-VI compound semiconductor material, or an organic semiconductor material. In one embodiment, each semiconductor fin 18 can include a single crystalline elemental semiconductor material, a single crystalline semiconductor material primarily composed of Group IV elements, a single crystalline III-V compound semiconductor material, a single crystalline II-VI compound semiconductor material, or a single crystalline organic semiconductor material. In another embodiment, each semiconductor fin 18 can consist essentially of undoped single crystalline silicon or single crystalline silicon doped with p-type dopant atoms or n-type dopant atoms.

As used herein, a "semiconductor fin" refers to a semiconductor structure including a portion having a shape of a rectangular parallelepiped. The direction along which a semiconductor fin 18 laterally extends the most is herein referred to as a "lengthwise direction" of the semiconductor fin 18. The height of each semiconductor fin 18 can be in a range from 5 nm to 300 nm, although lesser and greater heights can also be employed. The width of each semiconductor fin 18 can be in a range from 5 nm to 100 nm, although lesser and greater widths can also be employed. Multiple semiconductor fins 18 may be arranged such that the multiple semiconductor fins 18 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each semiconductor fin 18 includes a pair of parallel sidewalls along the lengthwise direction and a pair of parallel sidewalls along the widthwise direction and at each end segment of the semiconductor fin 18.

In one embodiment, each semiconductor fin 18 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In another embodiment of the present application, each semiconductor fin 18 can be formed utilizing a SIT (sidewall image transfer) process. In a typical SIT process, spacers are formed on sidewall surface of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 18 has been formed.

Referring now to FIGS. 2A-2B, there is illustrated the exemplary semiconductor structure of FIGS. 1A-1B after forming a sacrificial gate stack 26 straddling each semiconductor fin 18; it is noted the handle substrate 12 has been omitted from these drawings as well as the remaining drawings for clarity. In some embodiments and as shown, the sacrificial gate stack 26 includes, from bottom to top, a sacrificial gate dielectric layer 20, a sacrificial gate material layer 22 and a sacrificial gate cap layer 24. In some embodiments, the sacrificial gate dielectric layer 20 can be omitted.

When present, the sacrificial gate dielectric layer 20 may include a semiconductor oxide, a semiconductor nitride, and/or a semiconductor oxynitride. In one example, the sacrificial gate dielectric layer 20 may be composed of silicon dioxide, silicon nitride and/or silicon oxynitride. In another embodiment of the present application, the sacrificial gate dielectric layer 20 may include at least a dielectric metal oxide. Exemplary dielectric metal oxides that can be used as sacrificial gate dielectric layer 20 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The sacrificial gate dielectric layer 20 may include a single dielectric material layer. In other embodiments, the sacrificial gate dielectric layer 20 may include a multilayered sacrificial gate dielectric structure. The thickness of the sacrificial gate dielectric layer 20 can range from 1 nm to 10 nm, although lesser and greater thicknesses can also be employed.

In some embodiments of the present application, the sacrificial gate dielectric layer 20 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the sacrificial gate dielectric layer 20 can be formed by a thermal growth technique such as, for example, thermal oxidation and/or thermal nitridation. In yet a further embodiment of the present application, a combination of a deposition and thermal growth may be used in forming a multilayered sacrificial gate dielectric structure.

The sacrificial gate material layer 22 can include any material (semiconductor, dielectric or conductive) that can be selectively removed from the structure during a subsequently performed etching process. In one embodiment, the sacrificial gate material layer 22 may be composed of polysilicon. In another embodiment, the sacrificial gate material layer 22 may be composed of a metal such as, for example, Al, W, or Cu. The sacrificial gate material layer 22 can be formed, for example, by chemical vapor deposition or plasma enhanced chemical vapor deposition. The thickness of sacrificial gate material layer 22 can be from 50 nm to 300 nm, although lesser and greater thicknesses can also be employed.

The sacrificial gate cap layer 24 may be composed of a dielectric oxide, dielectric nitride and/or a dielectric oxynitride nitride. In one embodiment, sacrificial gate cap layer 24 can be composed of silicon dioxide, a silicon nitride and/or a silicon oxynitride. In one embodiment, the sacrificial gate cap layer 24 can be formed utilizing a thermal process such as, for example, a thermal oxidation or a thermal nitridation process. In another embodiment, the sacrificial gate cap layer 24 can be formed by a deposition process such as, for example, chemical vapor deposition (CVD), and plasma enhanced chemical vapor deposition (PECVD). The thickness of the sacrificial gate cap layer 24 can be from 5 nm to 50 nm, although lesser and greater thicknesses can also be employed.

Figure 3B:
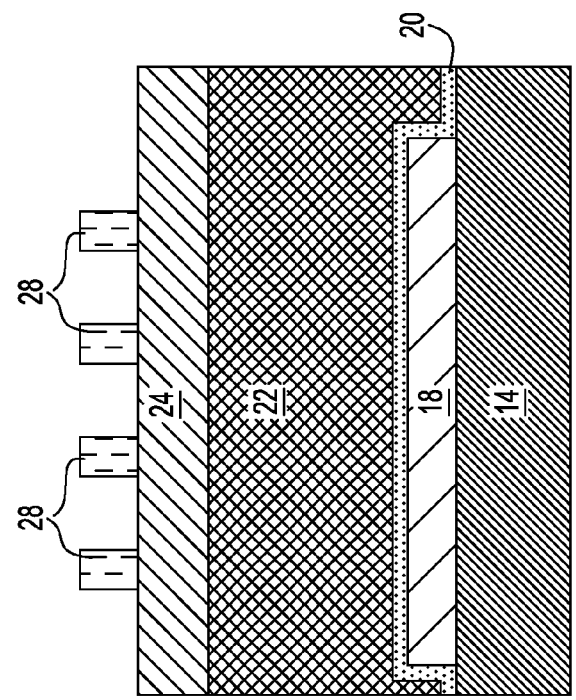
FIG. 3B is a vertical cross-sectional view of the exemplary semiconductor structure along the vertical plane B-B' of FIG. 3A.

Referring now to FIGS. 3A-3B, there are illustrated the exemplary semiconductor structure of FIGS. 2A-2B after forming a plurality of hard mask structures 28 on a topmost surface of the sacrificial gate stack 26. Each hard mask structure 28 has a bottommost surface that is in direct physical contact with a topmost surface of the sacrificial gate cap layer 24.

Each hard mask structure 28 is composed of a different material than the material that provides the sacrificial gate cap layer 24. In one embodiment, each hard mask structure 28 can be composed of amorphous silicon. The plurality of hard mask structures 28 can be formed by first depositing a blanket layer of hard mask material on the topmost surface of the sacrificial gate structure 26. The blanket layer of hard mask material is then patterned forming the plurality of hard mask structures 28 on a topmost surface of the sacrificial gate stack 26. In one embodiment, the patterning of the blanket layer of hard mask material may be performed by lithography and etching. In another embodiment, a SIT process can be used in forming the plurality of hard mask structures 28 on a topmost surface of the sacrificial gate stack 26.

The height of each hard mask structure 28, as measured from a bottommost surface to a topmost surface, can be from 50 nm to 200 nm, although lesser and greater heights can also be employed. The width of each hard mask structure 28, as measured from a one sidewall surface to an opposing sidewall surface, can be from 5 nm to 30 nm, although lesser and greater widths can also be employed. Sidewalls of each hard mask structure 28 are substantially vertical to the topmost surface of the substrate 10. By "substantially vertical" it is meant that the sidewalls of each hard mask structure 28 are within ±5° from 90°.

Figure 4A:
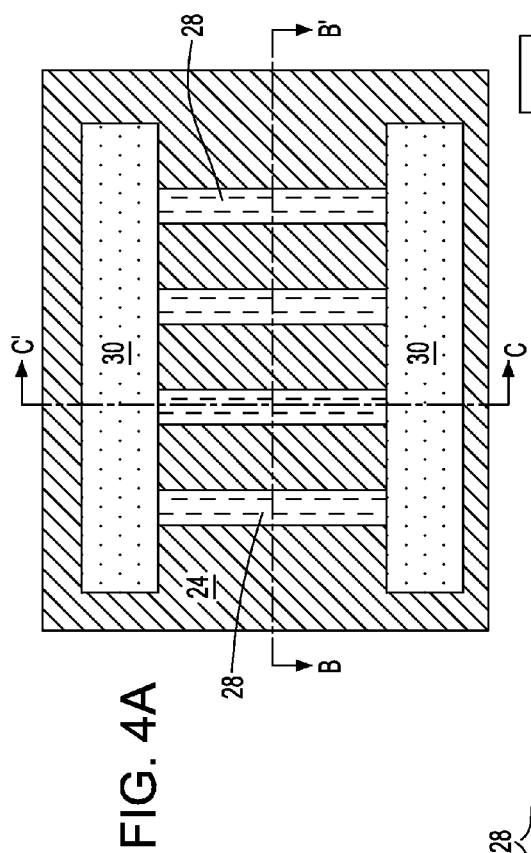
FIG. 4A is a top-down view of the exemplary semiconductor structure of FIG. 3A after forming an anchoring element along end segments of each hard mask structure.
Figure 4C:
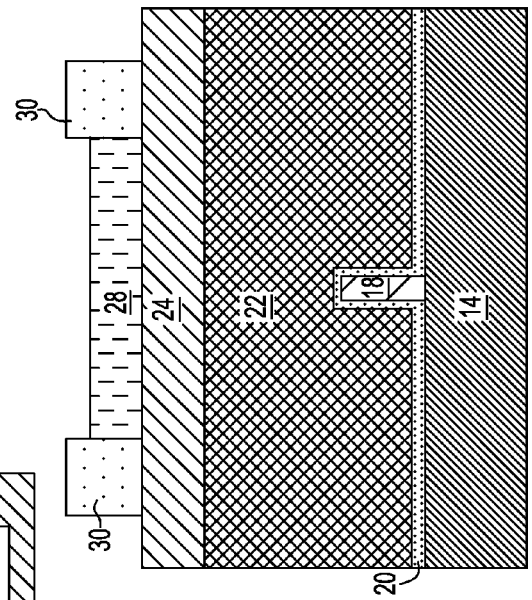
FIG. 4C is a vertical cross-sectional view of the exemplary semiconductor structure along the vertical plane C-C' of FIG. 4A.
Figure 4B:
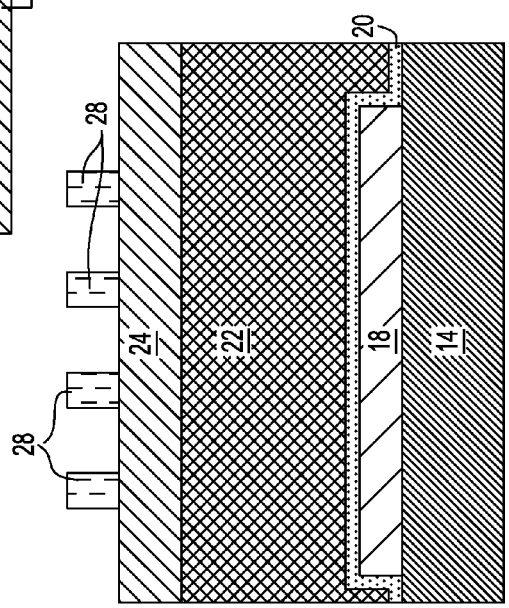
FIG. 4B is a vertical cross-sectional view of the exemplary semiconductor structure along the vertical plane B-B' of FIG. 4A.

Referring now to FIGS. 4A-4C, there are shown the exemplary semiconductor structure of FIGS. 3A-3B after forming an anchoring element 30 along and over end segments of each hard mask structure 28. Although the anchoring element 30 is described and illustrated as being formed along and over end segments of each hard mask structure 28, the anchoring element 30 can be formed wherever is it desired and needed to anchor a structure. Each anchoring element 30 is formed orthogonal to each hard mask structure 28 rendering the hard mask structures 28 mechanically stable. The now anchored hard mask structures (the combination of elements 28 and 30) that are formed on the topmost surface of the sacrificial gate stack 26 are used as a gate etch mask during subsequent etching of the sacrificial gate stack 26.

In some embodiments, each anchoring element 30 may comprise a masking material that is the same as the hard mask material that was used in providing the plurality of hard mask structures 28. In other embodiments, each anchoring element 30 may comprise a masking material that differs in composition than the hard mask material that was used in providing the plurality of hard mask structures 28. Each anchoring element 30 may be formed by depositing a blanket layer of hard mask material on the exposed surfaces of the sacrificial gate stack 26 and the exposed surfaces of each hard mask structure 28, and then patterning the blanket layer of hard mask material by lithography and etching.

The height of each anchoring element 30 may be greater than, less than, or the same as, the height of each hard mask structure 28. The drawings illustrate an embodiment in which the height of each anchoring element 30 is greater than the height of each hard mask structure 28. In one embodiment and by way of an example, the height of each anchoring element 30, as measured from a bottommost surface to a topmost surface, can be from 100 nm to 300 nm. The width of each anchoring element 30, as measured from a one sidewall surface to an opposing sidewall surface, can be from 5 nm to 30 nm, although lesser and greater widths can also be employed. Sidewalls of each anchoring element 30 are substantially vertical to the topmost surface of the substrate 10. By "substantially vertical" it is meant that the sidewalls of each anchoring element 30 are within ±5° from 90°.

Referring now to FIGS. 5A-5B, there are shown the exemplary semiconductor structure of FIGS. 4A-4C after patterning the sacrificial gate stack 26 into a plurality of sacrificial gate structures 32. After the patterning step, the anchoring material 30 and each hard mask structure 28 are removed utilizing stripping techniques well known to those skilled in the art. Each sacrificial gate structure 32 that is formed lies perpendicular to, and straddles at least one portion of each semiconductor fin 18.

The patterning of the sacrificial gate stack 26 utilizes the anchored hard mask structures (the combination of elements 28 and 30) as a gate etch mask. Etching can be performed utilizing any anisotropic etching process such as, for example, reactive ion etching. In some embodiments, and as illustrated, each sacrificial gate structure 32 includes a remaining portion of the sacrificial gate dielectric layer 20, a remaining portion of the sacrificial gate material layer 22 and a remaining portion of sacrificial gate cap layer 24. In some embodiments, remaining portions of the sacrificial gate dielectric layer 20 can be omitted from each sacrificial gate structure 32.

The remaining portion of the sacrificial gate dielectric layer 20 of each sacrificial gate structure 32 is referred to herein as a sacrificial gate dielectric portion 20$p$, the remaining portion of the sacrificial gate material layer 22 of each sacrificial gate structure 32 is referred to herein as a sacrificial gate material portion 22$p$, and the remaining portion of the sacrificial gate cap layer 24 of each sacrificial gate structure 32 is referred to herein as a sacrificial gate cap portion 24$p$. As is shown, end segments of each sacrificial gate cap portion 24$p$ are connected to a sacrificial gate cap anchoring portion 24$a$. Each sacrificial gate structure 32 that is formed in the present application is mechanically stable due to the presence of the sacrificial gate cap anchoring portion 24$a$ located at each end segment of the sacrificial gate cap portion 24$p$ of each sacrificial gate structure 32.

The height of each sacrificial gate structure 32, as measured from a bottommost surface to a topmost surface, can be from 50 nm to 200 nm, although lesser and greater heights can also be employed. The width of each sacrificial gate structure 32, as measured from a one sidewall surface to an opposing sidewall surface, can be from 5 nm to 30 nm, although lesser and greater widths can also be employed. Sidewalls of each sacrificial gate structure 32 are substantially vertical to the topmost surface of the substrate 10. By "substantially vertical" it is meant that the sidewalls of each sacrificial gate structure 32 are within ±5° from 90°.

Figure 6A:
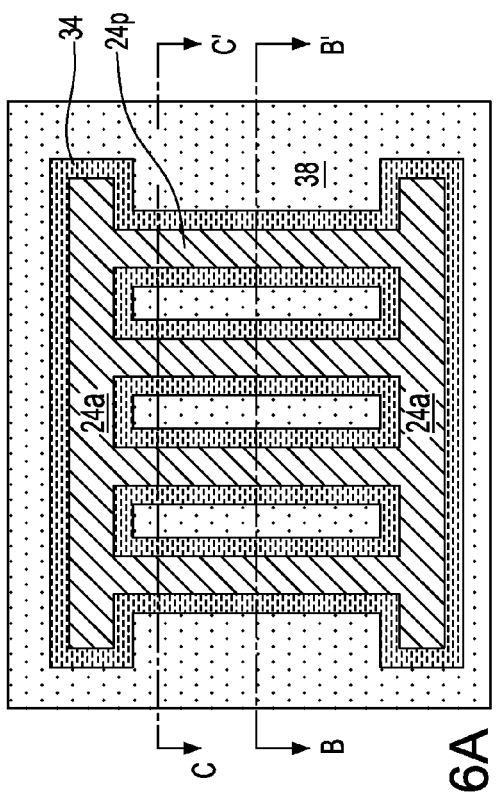
FIG. 6A is a top-down view of the exemplary semiconductor structure of FIG. 5A after forming a dielectric spacer comprising a first dielectric material, epitaxial semiconductor material portions, and a planarization dielectric layer.
Figure 6C:
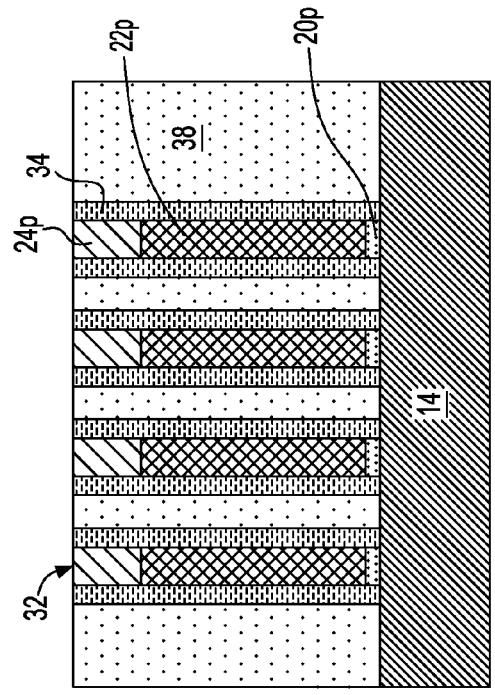
FIG. 6C is a vertical cross-sectional view of the exemplary semiconductor structure along the vertical plane C-C' of FIG. 6A.
Figure 6B:
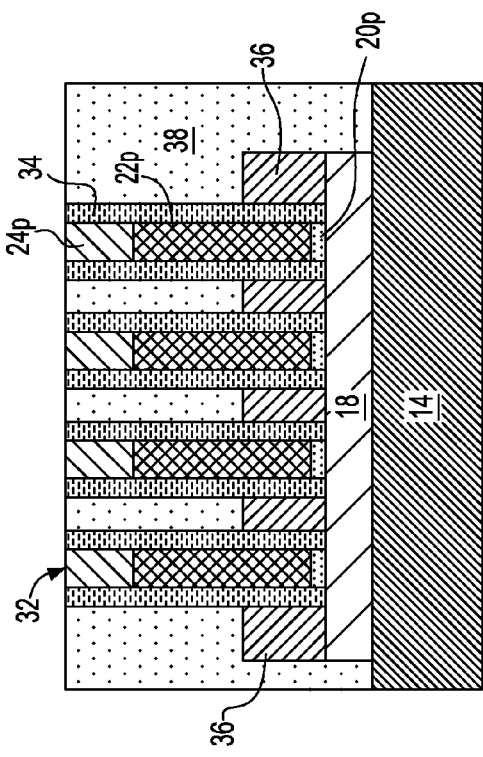
FIG. 6B is a vertical cross-sectional view of the exemplary semiconductor structure along the vertical plane B-B' of FIG. 6A.

Referring now to FIGS. 6A-6C, there are illustrated the exemplary semiconductor structure of FIGS. 5A-5B after forming a dielectric spacer 34, epitaxial semiconductor material portions 36, and a planarization dielectric layer 38.

The dielectric spacer 34 is formed entirely on the sidewalls of the sacrificial gate cap anchoring portion 24$a$ and entirely on the sidewalls of each sacrificial gate structure 32. The dielectric spacer 34 also straddling portions of each semiconductor fin 18. The dielectric spacer 34 can be provided by depositing a layer of a first dielectric material and then performing an anisotropic etch. The first dielectric material that is used in providing the dielectric spacer 34 comprises a dielectric material (e.g., a spacer dielectric material) that differs from at least the material of the sacrificial gate dielectric layer, and the material of the sacrificial cap material layer.

In one embodiment of the present application, the first dielectric material that is used in providing the dielectric spacer 34 may be a dielectric material having a dielectric constant of less than silicon dioxide (such dielectric materials may be referred to herein as low k). Examples of dielectric materials having a low dielectric constant include, but are not limited to, silsesquioxanes, C-doped oxides (i.e., organic silicates) that include atoms of Si, C, O and H, and thermosetting polyarylene ethers. The term "polyarylene" is used throughout the present application to denote aryl moieties or inertly substituted aryl moieties which are linked together by bonds, fused rings, or inert linking groups such as, for example, oxygen, sulfur, sulfone, sulfoxide, carbonyl and the like.

In another embodiment of the present application, the first dielectric material that is used in providing the dielectric spacer 34 may be a dielectric material having a dielectric constant that is equal to or even greater than that of silicon dioxide (such dielectric materials may be referred to herein as high k). Examples of high k dielectric materials include, for example, silicon dioxide, silicon nitride and silicon oxynitride.

In some embodiments (not shown), exposed portions of each semiconductor fin 18 can be doped at this point of the present application to form a source region within exposed portions of each semiconductor fin 18 and one side of each sacrificial gate structure 32, while forming a drain region within the other exposed portions of each semiconductor fin 18 and on the other side of each sacrificial gate structure 32. The doping of the exposed portions of each semiconductor fin 18 can be performed by gas phase doping, plasma doping, or a gas cluster ion beam process. The doping including introducing a p-type dopant or an n-type dopant into the exposed portions of each semiconductor fin 18. As will be understood by those skilled in the art, the exposed portions of each semiconductor fin on one side of the gate structure will serve as the source region of the semiconductor device, while the exposed portions of each semiconductor fin on the other side of the gate structure will serve as the drain region of the semiconductor device.

After forming at least the dielectric spacer 34, epitaxial semiconductor material portions 36 can be formed on exposed portions of each semiconductor fin 18 to form a raised source region within exposed portions of each semiconductor fin 18 and one side of each sacrificial gate structure 32, while forming a raised drain region within the other exposed portions of each semiconductor fin 18 and on the other side of each sacrificial gate structure 32. The epitaxial semiconductor material portions 36 are typically doped with a p-type dopant or an n-type dopant. Doping can be achieved during the deposition of the epitaxial semiconductor material portions 36 or after intrinsic semiconductor material portions have been deposited using one of the doping techniques mentioned above. In some embodiments, the epitaxial semiconductor material portions 36 can be used to merge neighboring fins.

The semiconductor material that is used in forming the epitaxial semiconductor material portions 36 is formed by a selective epitaxial growth process on the exposed portions of each semiconductor fin 18. As such, each epitaxial semiconductor material portions has an epitaxial relationship with the surface of the exposed surface portion of each semiconductor fin 18. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon oxide or silicon nitride surfaces.

Examples of various epitaxial growth process apparatuses that are suitable for use in forming the epitaxial semiconductor material portions 36 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the semiconductor material that provides the epitaxial semiconductor material portions 36 typically ranges from 550° C. to 900° C. Although higher temperature typically results in faster deposition, the faster deposition may result in crystal defects and film cracking.

In one embodiment of the present application, the semiconductor material that is used in forming the epitaxial semiconductor material portions 36 may be the same as that of the semiconductor material of each semiconductor fin 18. In another embodiment of the present application, the semiconductor material that is used in forming the epitaxial semiconductor material portions 36 may be differ from the semiconductor material that provides each semiconductor fin 18.

A number of different sources may be used for the deposition of the epitaxial semiconductor material portions 36. In some embodiments, the gas source for the deposition of the epitaxial semiconductor material portions 36 include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, the epitaxial growth of the epitaxial semiconductor material portions 36 can include a dopant gas used in conjunction with the source gas; such a process may be referred to herein as an in-situ doping epitaxial growth process. The dopant gas that can be present in the epitaxial growth process provides a conductivity type, either n-type or p-type, to the epitaxial semiconductor material portions 36. When epitaxial semiconductor material portions 36 of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.00001% to 2%. In another example, when the conductivity type dopant is n-type, the dopant gas include phosphine gas ($PH_3$) present in a ratio to silane ($SiH_4$) ranging from 0.0001% to 0.1%.

When epitaxial semiconductor material portions 36 of a p-type conductivity are to be formed, a dopant gas including at least one p-type dopant, e.g., B, is employed as the semiconductor material. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.00001% to 2%. In another embodiment, wherein the conductivity type dopant is p-type, the dopant gas may be diborane ($B_2H_6$) present in a ratio to silane ($SiH_4$) ranging from 0.0001% to 0.1%. In yet another embodiment, in which the conductivity type dopant is p-type, the dopant gas for may be trimethylboron (TMB) present in a ratio to silane ($SiH_4$) ranging from 0.1% to 10%.

In one embodiment, in which the epitaxial semiconductor material portions 36 include a p-type dopant, the p-type dopant is present within the epitaxial semiconductor material portions 36 in a concentration ranging from $1 \times 10^{19}$ atoms/$cm^3$ to $10^{21}$ atoms/$cm^3$. In another embodiment, in which the epitaxial semiconductor material portions 36 contain p-type dopant, the p-type dopant is present in a concentration ranging from $1\times10^{20}$ atoms/cm$^3$ to $8\times10^{20}$ atoms/cm$^3$. In one embodiment, in which the epitaxial semiconductor material portions 36 contains an n-type dopant, the n-type dopant is present in the epitaxial semiconductor material portions 36 in a concentration ranging from $1\times10^{19}$ atoms/cm$^3$ to $10^{21}$ atoms/cm$^3$. In another embodiment, in which the epitaxial semiconductor material portions 36 contain an n-type dopant, the n-type dopant is present in a concentration ranging from $1\times10^{20}$ atoms/cm$^3$ to $8\times10^{20}$ atoms/cm$^3$. The dopant within the epitaxial semiconductor material portions 36 can be uniformly present or present as a gradient.

In some embodiments of the present application, the epitaxial semiconductor material portions 36 can be hydrogenated. When hydrogenated, a hydrogen source is used in conjunction with the other source gases and the amount of hydrogen that is present within the epitaxial semiconductor material portions 36 can be from 1 atomic percent to 40 atomic percent. In another embodiment, carbon can be present in the epitaxial semiconductor material portions 36. When present, a carbon source (such as, for example, monomethylsilane) is used in conjunction with the other source gases and carbon, C, can be present in the epitaxial semiconductor material portions 36 in range from 0 atomic % to 4 atomic %.

After forming the dielectric spacer 34 and the epitaxial semiconductor material portions 36, a planarization dielectric layer 38 is deposited over each semiconductor fin 18, the sacrificial gate structures 32, and the sacrificial gate cap anchoring portion 24a, and can be subsequently planarized employing the remaining sacrificial gate cap portions 24p and the sacrificial gate cap anchoring portion 24a as a stopping layer. The planarization dielectric layer 38 includes a dielectric material that may be easily planarized. For example, the planarization dielectric layer 38 can be composed of a doped silicate glass or an undoped silicate glass (silicon oxide). The planarization can be performed, for example, by chemical mechanical planarization (CMP). The planarization dielectric layer 38 laterally surrounds each semiconductor fin 18 and each the sacrificial gate structure 32. After planarization, the planarization dielectric layer 38 has a topmost surface that is coplanar with a topmost surface of each sacrificial gate structure 32.

Referring now to FIGS. 7A-7B, there are shown the exemplary semiconductor structure of FIGS. 6A-6C after removing each sacrificial gate cap anchoring portion 24a and underlying portions of the sacrificial gate material and underlying portions of the sacrificial gate dielectric to form a spacer cavity 40. The removal of each sacrificial gate cap anchoring portion 24a and underlying portions of the sacrificial gate material and underlying portions of the sacrificial gate dielectric can be achieved by etching. The sacrificial gate structures 32 are mechanically stable at this junction of the present application since they are bounded by the planarization dielectric layer 38.

Figure 8A:
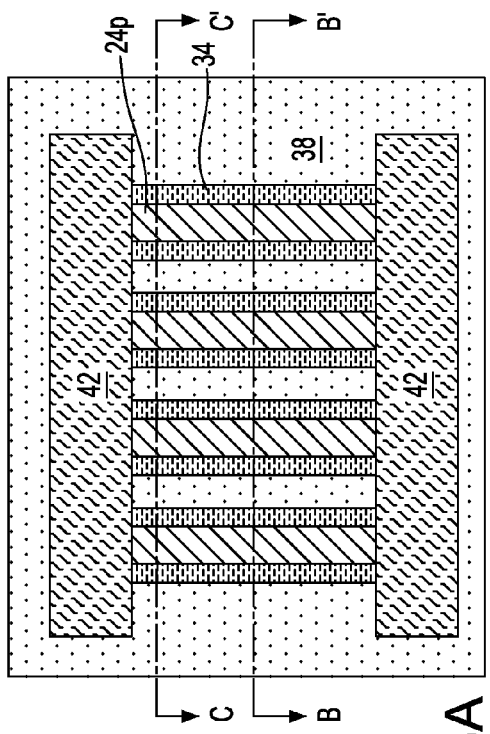
FIG. 8A is a top-down view of the exemplary semiconductor structure of FIG. 7A after filling the spacer cavity with a second dielectric material that comprises a different dielectric material than the first dielectric material that provides the dielectric spacer.
Figure 8C:
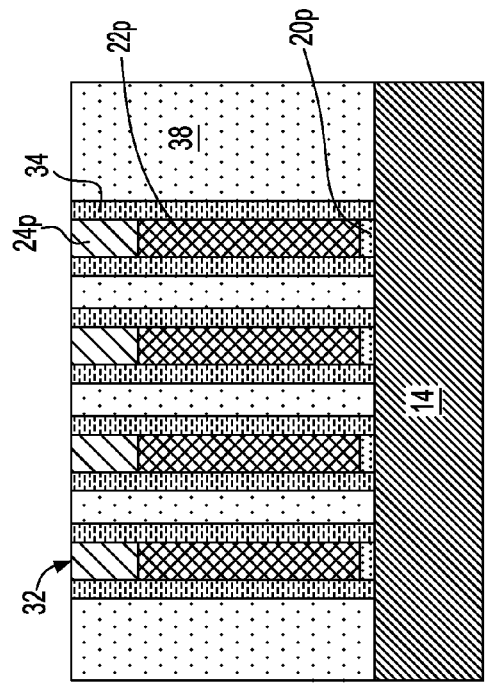
FIG. 8C is a vertical cross-sectional view of the exemplary semiconductor structure along the vertical plane C-C' of FIG. 8A.
Figure 8B:
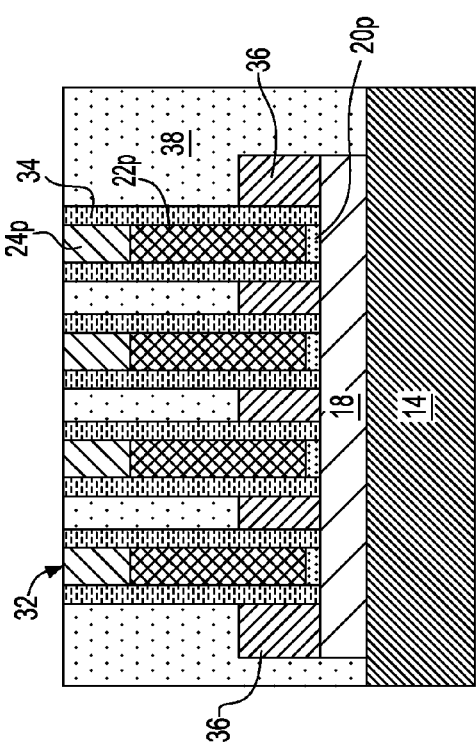
FIG. 8B is a vertical cross-sectional view of the exemplary semiconductor structure along the vertical plane B-B' of FIG. 8A.
Figure 9C:
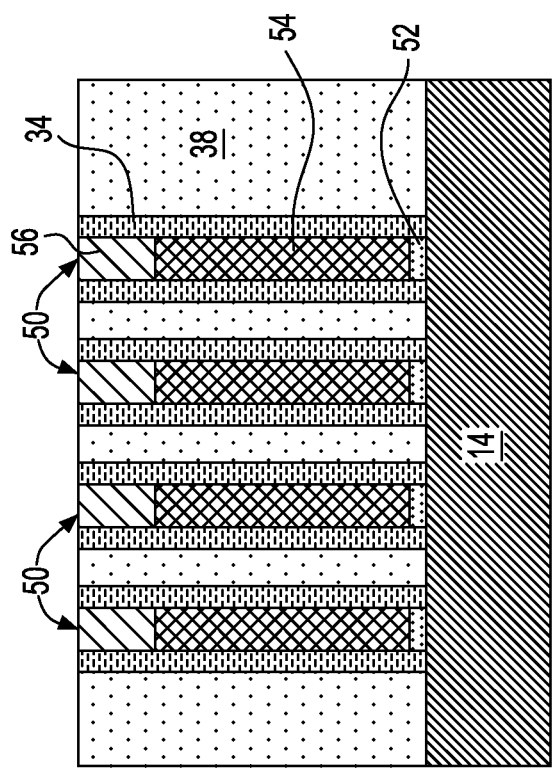
FIG. 9C is a vertical cross-sectional view of the exemplary semiconductor structure along the vertical plane C-C' of FIG. 9A.
Figure 9D:
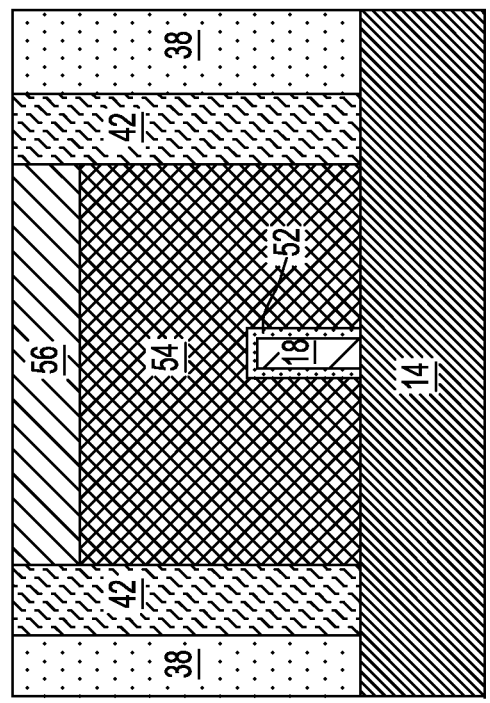
FIG. 9D is a vertical cross-sectional view of the exemplary semiconductor structure along the vertical plane D-D' of FIG. 9A.

Referring now to FIGS. 8A-8C, there are shown the exemplary semiconductor structure of FIGS. 7A-7B after filling spacer cavity 40 with a second dielectric material 42 that comprises a different dielectric material than the first dielectric material used in providing the dielectric spacer 34. In one embodiment, filling of the spacer cavity 40 comprises depositing of the second dielectric material (i.e., dielectric spacer material or dielectric fill material) and then an optional planarization process such as chemical mechanical planarization may be performed. In one embodiment, the second dielectric material 42 comprises a high k dielectric such as silicon nitride, while the dielectric spacer 34 comprises a low k dielectric.

Referring now to FIGS. 9A-9D, there are shown the exemplary semiconductor structure of FIGS. 8A-8C after removing each sacrificial gate structure 32 and forming a functional gate structure 50 into a gate cavity previously occupied by each sacrificial gate structure 32. The functional gate structure 50 straddles portions of each semiconductor fin 18.

Each sacrificial gate structure 32 can be removed by at least one etch. The at least one etch can be a recess etch, which can be an isotropic etch or anisotropic etch. The etch processes employed to remove the sacrificial gate cap portions 24p, the sacrificial gate material portion 24p and the sacrificial gate dielectric portion 20p can be selective to the dielectric materials of the planarization dielectric layer 38 and the second dielectric material 42. The etch chemistry employed to remove the sacrificial gate structures 32 is selective to the semiconductor materials of each semiconductor fin 18. Thus, the sacrificial gate structure 32 can be removed selective to the planarization dielectric layer 38, to the semiconductor material of the semiconductor fins 18 and second dielectric material 42. A gate cavity is formed in a volume from which the sacrificial gate structure 32 is removed. The gate cavity can be laterally enclosed by the first and second spacer 34, 42 and the planarization dielectric layer 38.

Each functional gate structure 50 includes a gate dielectric 52 and a gate conductor 54. An optional gate cap 56 can be located on the gate conductor material 54.

In one embodiment, and as shown, each functional gate structure 50 can be formed by forming a gate material stack of, from bottom to top, a blanket layer of gate dielectric material (which is used to provide the gate dielectric 52 of each functional gate structure 50), a blanket layer of a gate conductor material (which is used to provide the gate conductor 54 of each functional gate structure 50), and optionally, a blanket layer of a gate cap material (which is used to provide the gate cap 56 of each functional gate structure 50).

The blanket layer of gate dielectric material that is can be used may include a semiconductor oxide, semiconductor nitride, semiconductor oxynitride, or a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon oxide, and a high k gate dielectric can be formed.

The blanket layer of gate dielectric material can be formed by any deposition technique including, for example, chemical vapor deposition (CVD), plasma enhanced chemical vapor deposition (PECVD), physical vapor deposition (PVD), and sputtering, atomic layer deposition. In some embodiments, a thermal growth technique can be used in forming the blanket layer of gate dielectric material. In one embodiment of the present application, the blanket layer of gate dielectric material can have a thickness in a range from 1 nm to 10 nm. Other thicknesses that are lesser than or greater than the aforementioned thickness range can also be employed for the blanket layer of gate dielectric material.

After providing the blanket layer of gate dielectric material, a blanket layer of gate conductor material can be formed atop the blanket layer of gate dielectric material. The blanket layer of gate conductor material can include any conductive material including, for example, a doped semiconductor-containing material, (i.e., doped polysilicon or doped SiGe), an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The blanket layer of gate conductor material can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the blanket layer of gate conductor material has a thickness from 1 nm to 100 nm. Other thicknesses that are lesser than or greater than the aforementioned thickness range can also be employed for the blanket layer of gate conductor material.

A blanket layer of gate cap material can be formed atop the blanket layer of gate conductor material. In some embodiments, the blanket layer of gate cap material is optional. When present, the blanket layer of gate cap material comprises one of the materials mentioned above for providing the sacrificial gate cap. For example, the blanket layer of gate cap material can be composed of silicon dioxide and/or silicon nitride. The blanket layer of gate cap material can be formed utilizing one of the techniques mentioned above in forming the sacrificial gate cap. In one embodiment, the blanket layer of gate cap material has a thickness from 20 nm to 100 nm. Other thicknesses that are lesser than or greater than the aforementioned thickness range can also be employed for the blanket layer of gate cap material.

FIGS. 9A-9D illustrate a semiconductor structure in accordance with an embodiment of the present application. The semiconductor structure of the present application includes at least one semiconductor fin 18 located on a surface of a substrate (i.e., insulator layer 14). A plurality of functional gate structures 50 straddles a portion of the semiconductor fin 18. A dielectric spacer 34 is located on sidewalls of each functional gate structure of the plurality of functional gate structures 50 and straddling another portion of the semiconductor fin 18. A second dielectric material 42 is located on end portions of each functional gate structure 50. In accordance with the present application, the second dielectric material 42 comprises a different material than first dielectric material used in providing the dielectric spacer 34 and the second dielectric material 42 is located orthogonal to the dielectric spacer 34 and each functional gate structure 50.

As is shown, a bottommost surface of the second dielectric material 42 directly contacts a topmost surface of the substrate (i.e., insulator layer 14), and a sidewall surface of second dielectric material 42 directly contacts a sidewall surface each functional gate structure 50. Planarization dielectric layer 38 surrounds each semiconductor fin 18 and each functional gate structure 50. As shown, dielectric spacer 34 has a bottommost surface that directly contacts the topmost surface of the substrate (i.e., insulator layer 14) and the dielectric spacer 34 completely separates the planarization dielectric layer 38 from the functional gate structures 50. Each functional gate structure 50 has a height and width that equals that of the sacrificial gate structure that it replaced. The planarization dielectric layer 38, the dielectric spacer 34 and the second dielectric material 42 each have a topmost surface that is coplanar with a topmost surface of the each functional gate structure 50.

It is again emphasized that the present application works for any device including, for example, planar devices, nanowire containing devices and nanotube containing devices that requires tall sacrificial gates.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming a sacrificial gate stack over a surface of a substrate;
    providing a plurality of hard mask structures on a topmost surface of said sacrificial gate stack, wherein an anchoring element is disposed over segments of each hard mask structure;
    patterning said sacrificial gate stack into a plurality of sacrificial gate structures utilizing said plurality of hard mask structures and said anchoring element as an etch mask;
    removing each hard mask structure to expose a sacrificial gate cap portion of each sacrificial gate structure, wherein end segments of each sacrificial gate cap portion are connected to a sacrificial gate cap anchoring portion;
    forming a dielectric spacer comprising a first dielectric material on sidewalls of each of said sacrificial gate structures and sidewalls of said sacrificial gate cap anchoring portion;
    forming a planarization dielectric layer laterally surrounding each of said sacrificial gate structures, wherein said planarization dielectric layer has a topmost surface that is coplanar with a topmost surface of each of said sacrificial gate structures; and
    removing each sacrificial gate cap anchoring portion to form a spacer cavity.

2. The method of claim 1, further comprising forming a second dielectric material in said spacer cavity and along end segments of each sacrificial gate structure, wherein said second dielectric material comprises a different material than the first dielectric material of said dielectric spacer.

3. The method of claim 2, further comprising removing each of said sacrificial gate structures and replacing the same with a functional gate structure.

4. The method of claim 3, wherein said removing said sacrificial gate structure comprises a recessed etch.

5. The method of claim 3, wherein said functional gate structure is formed by depositing a blanket layer of a gate dielectric material; and depositing a blanket layer of a gate conductor material on said blanket layer of gate dielectric material.

6. The method of claim 5, further comprising depositing a blanket layer of a gate gap material on said blanket layer of gate conductor material.

7. The method of claim 1, wherein said anchoring element is formed by depositing a layer of a masking material and patterning the layer of masking material by lithography and etching.

8. The method of claim 1, wherein said forming said sacrificial gate stack comprising first depositing a sacrificial gate dielectric, second depositing a sacrificial gate material on said sacrificial gate dielectric, and third depositing a sacrificial gate cap on said sacrificial gate material.

9. The method of claim 1, wherein each of said sacrificial gate structure has a height from 50 nm to 200 nm, and a width from 5 nm to 30 nm.

10. The method of claim 1, wherein said sacrificial gate stack straddles a semiconductor fin that extends upward from a surface of said substrate.

11. The method of claim 1, wherein said substrate includes at least one semiconductor fin, and said sacrificial gate structure straddles said at least one semiconductor fin.

12. The method of claim 11, wherein said at least one semiconductor fin is formed by a sidewall image transfer process.

13. The method of claim 11, wherein said dielectric spacer has a bottommost surface contacting a portion of said at least one semiconductor fin.

14. The method of claim 13, further comprising forming epitaxial semiconductor material portions on other portions of said at least one semiconductor fin.

15. The method claim 14, further comprising:
   forming a second dielectric material in said spacer cavity and along end segments of each sacrificial gate structure, wherein said second dielectric material comprises a different material than the first dielectric material of said dielectric spacer; and
   removing each of said sacrificial gate structures and replacing the same with a functional gate structure.

* * * * *